(12) United States Patent
Han et al.

(10) Patent No.: US 11,569,833 B2
(45) Date of Patent: Jan. 31, 2023

(54) ANALOG TO DIGITAL CONVERTER DEVICE AND METHOD FOR CONTROLLING CALIBRATION CIRCUIT

(71) Applicants: GLOBAL UNICHIP CORPORATION, Hsinchu (TW); TAIWAN SEMICONDUCTOR MANUFACTURING COMPANY, LTD., Hsinchu (TW)

(72) Inventors: Hsin-Han Han, Hsinchu (TW); Yu-Chu Chen, Hsinchu (TW); Wen-Juh Kang, Hsinchu (TW)

(73) Assignees: GLOBAL UNICHIP CORPORATION, Hsinchu (TW); TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/450,288

(22) Filed: Oct. 8, 2021

(65) Prior Publication Data
US 2022/0345142 A1    Oct. 27, 2022

(30) Foreign Application Priority Data
Apr. 21, 2021    (TW) .................................. 110114411

(51) Int. Cl.
*H03M 1/10*    (2006.01)
(52) U.S. Cl.
CPC ................................. *H03M 1/1028* (2013.01)
(58) Field of Classification Search
CPC .................................................. H03M 1/1028
USPC ........................................................... 341/120
See application file for complete search history.

(56) References Cited

U.S. PATENT DOCUMENTS

| | | | | |
|---|---|---|---|---|
| 6,081,215 A * | 6/2000 | Kost | ................... | H03M 1/1028 341/126 |
| 6,384,756 B1 * | 5/2002 | Tajiri | .................. | H03M 1/0836 341/120 |
| 6,567,022 B1 * | 5/2003 | Reuveni | .............. | H03M 1/1028 341/120 |
| 7,250,885 B1 | 7/2007 | Nairn | | |

(Continued)

FOREIGN PATENT DOCUMENTS

| TW | I693799 B | 5/2020 |
|---|---|---|
| TW | I699975 B | 7/2020 |

(Continued)

*Primary Examiner* — Lam T Mai
(74) *Attorney, Agent, or Firm* — CKC & Partners Co., LLC (57) ABSTRACT

An analog to digital converter (ADC) device includes ADC circuits, a calibration circuit and a controlling circuit. The ADC circuits are configured to generate first quantized outputs according to clock signals. The calibration circuit is configured to perform at least one error operation according to the first quantized outputs to generate second quantized outputs, and is configured to analyze time difference information of the clock signals according to the second quantized outputs to generate adjustment signals. The controlling circuit is configured to analyze the first quantized outputs to generate at least one control signal to the calibration circuit, wherein the at least one control signal is configured to control the calibration circuit to selectively perform the at least one error operation and selectively analyze the time difference information of the clock signals.

20 Claims, 4 Drawing Sheets

(56) References Cited

U.S. PATENT DOCUMENTS

| | | | |
|---|---|---|---|
| 7,522,077 B1 * | 4/2009 | Itkin | H03M 1/109 341/120 |
| 8,836,552 B1 * | 9/2014 | Tietjen | H03M 1/1038 341/118 |
| 8,860,589 B1 * | 10/2014 | Shivaram | H03M 1/0617 341/118 |
| 9,000,962 B1 * | 4/2015 | Leuciuc | H03M 1/121 341/120 |
| 9,270,291 B1 | 2/2016 | Parnaby et al. | |
| 9,369,142 B2 | 6/2016 | Qiu | |
| 2003/0080885 A1 * | 5/2003 | Tamba | H03M 1/1038 341/120 |
| 2009/0131010 A1 * | 5/2009 | Oshima | H03M 1/122 341/120 |
| 2012/0081246 A1 * | 4/2012 | Caci | H03M 1/1215 341/155 |
| 2012/0242520 A1 * | 9/2012 | Noguchi | H03M 1/0624 341/118 |
| 2013/0027233 A1 * | 1/2013 | Nozaki | H03M 1/12 341/118 |
| 2013/0027234 A1 * | 1/2013 | Yoshida | H03M 1/1004 341/118 |
| 2014/0002284 A1 * | 1/2014 | Tan | H03M 1/1052 341/118 |
| 2014/0104086 A1 * | 4/2014 | Zhang | H03M 1/1023 341/120 |
| 2014/0240158 A1 * | 8/2014 | Ishii | H03M 1/1023 341/161 |
| 2015/0326240 A1 * | 11/2015 | Tousi | H03M 1/46 341/118 |

FOREIGN PATENT DOCUMENTS

| | | |
|---|---|---|
| TW | I704773 B | 9/2020 |
| TW | I712267 B | 12/2020 |

* cited by examiner

ANALOG TO DIGITAL CONVERTER DEVICE AND METHOD FOR CONTROLLING CALIBRATION CIRCUIT

CROSS-REFERENCE TO RELATED APPLICATION

This application claims priority to Taiwan Application Serial Number 110114411, filed Apr. 21, 2021, which is herein incorporated by reference in its entirety.

BACKGROUND

Field of Invention

This disclosure relates to an analog-to-digital converter (ADC) device and a method for controlling calibration circuit, and in particular to a time-interleaved ADC device and a method for controlling calibration circuit.

Description of Related Art

ADCs are commonly used in various electronic devices to convert analog signals to digital signals for signal processing. In practical applications, an ADC will affect its own resolution or linearity due to a gain error, an offset error, or a timing error. The calibration performed by the prior art technologies for three aforementioned errors can be easily affected when the input signal is weak (e.g., the magnitude is too small, or the power is too small). As a result, the phase errors between different channels may be incorrectly converged.

SUMMARY

An aspect of present disclosure relates to an analog to digital converter device. The analog to digital converter device includes a plurality of analog to digital converter circuits, a calibration circuit and a controlling circuit. The analog to digital converter circuits are configured to convert an input signal according to a plurality of clock signals which is interleaved, to generate a plurality of first quantized outputs. The calibration circuit is configured to perform at least one error operation according to the first quantized outputs to generate at least one calibration information, is configured to calibrate the first quantized outputs by the at least one calibration information to generate a plurality of second quantized outputs, and is configured to analyze a plurality of time difference information of the clock signals according to the second quantized outputs to generate a plurality of adjustment signals, wherein the adjustment signals are configured to reduce a clock skew of the analog to digital converter circuits. The controlling circuit is configured to receive and analyze the first quantized outputs to generate at least one control signal to the calibration circuit, wherein the at least one control signal is configured to control the calibration circuit to selectively perform the at least one error operation and selectively analyze the time difference information of the clock signals.

Another aspect of present disclosure relates to a method for controlling calibration circuit. The method for controlling calibration circuit includes: by a controlling circuit, receiving a plurality of first quantized outputs generated according to a plurality of clock signals which is interleaved by a plurality of analog to digital converter circuits; by the controlling circuit, analyzing the first quantized outputs, to generate at least one control signal to a calibration circuit; by the calibration circuit, selectively performing at least one error operation to generate at least one calibration information and selectively analyzing a plurality of time difference information of the clock signals to generate a plurality of adjustment signals according to the at least one control signal, wherein the adjustment signals are configured to reduce a clock skew of the analog to digital converter circuits; and by the calibration circuit, calibrating the first quantized outputs, to generate a plurality of second quantized outputs.

DETAILED DESCRIPTION

The embodiments are described in detail below with reference to the appended drawings to better understand the aspects of the present disclosure. However, the provided embodiments are not intended to limit the scope of the disclosure, and the description of the structural operation is not intended to limit the order in which they are performed. Any device that has been recombined by components and produces an equivalent function is within the scope covered by the disclosure.

The terms used in the entire specification and the scope of the patent application, unless otherwise specified, generally have the ordinary meaning of each term used in the field, the content disclosed herein, and the particular content.

The terms "coupled" or "connected" as used herein may mean that two or more elements are directly in physical or electrical contact, or are indirectly in physical or electrical contact with each other. It can also mean that two or more elements interact with each other.

Figure 1A:
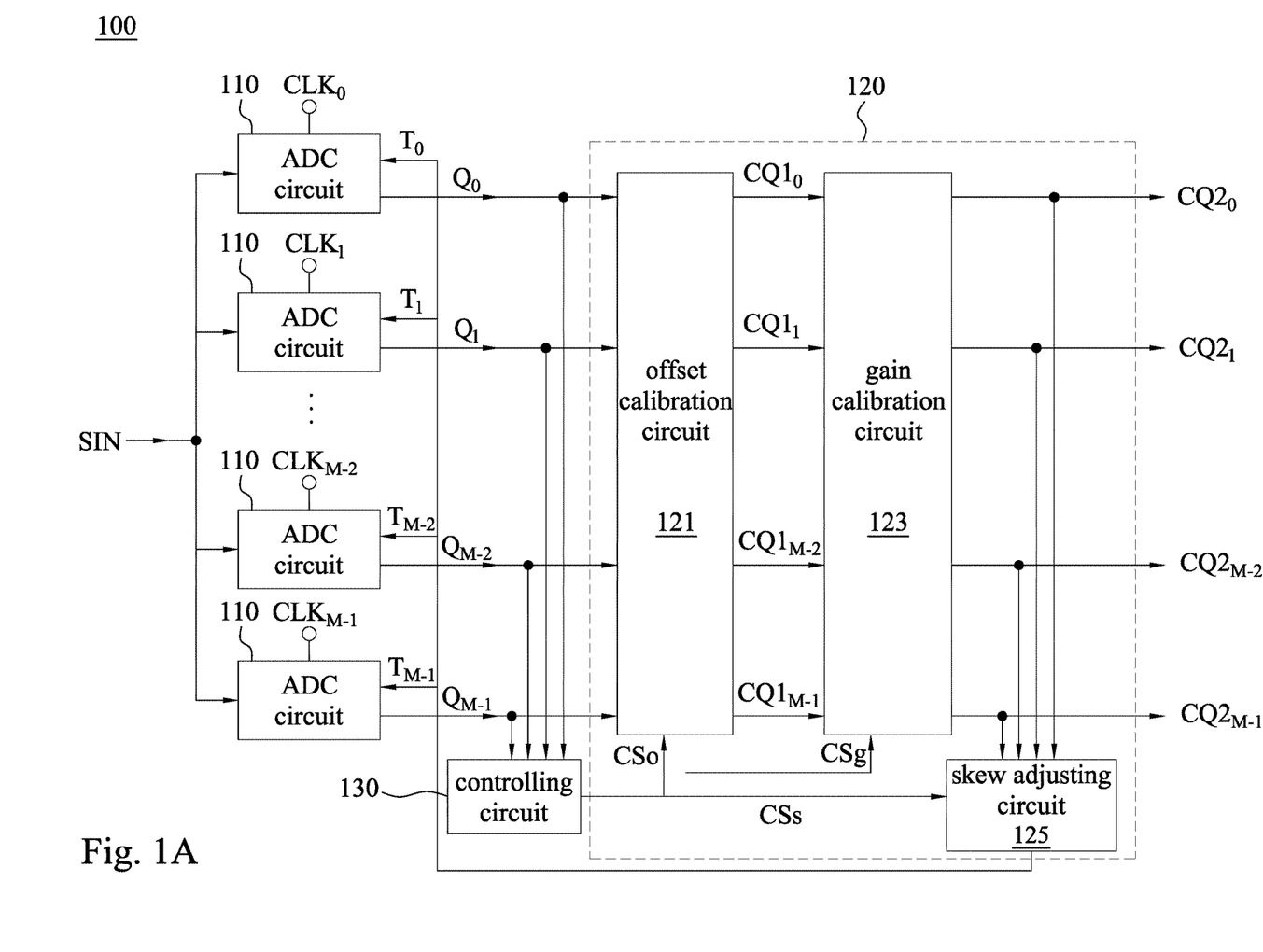
FIG. 1A depicts a schematic diagram of an ADC device in accordance with some embodiments of the present disclosure.
Figure 1B:
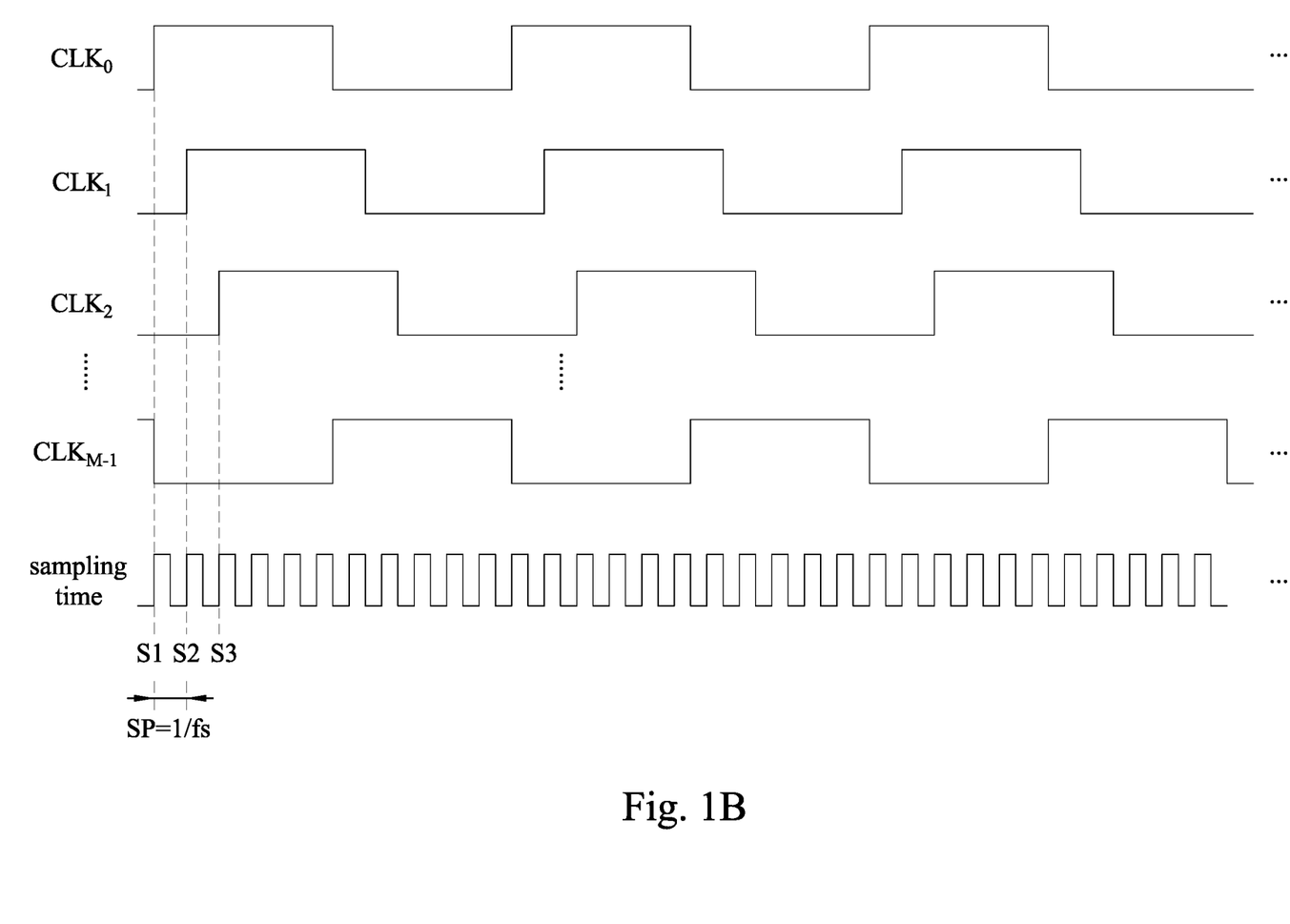
FIG. 1B depicts a schematic diagram of waveforms of a number of clock signals in FIG. 1A in accordance with some embodiments of the present disclosure.

Referring to FIGS. 1A and 1B, FIG. 1A depicts a schematic diagram of an ADC device 100 in accordance with some embodiments of the present disclosure. FIG. 1B depicts a schematic diagram of waveforms of a number of clock signals $CLK_0$-$CLK_{M-1}$ in FIG. 1A in accordance with some embodiments of the present disclosure. In some embodiments, the ADC device 100 is operated to be a time-interleaved ADC with multiple channels.

In some embodiments, the ADC device 100 includes a number of ADC circuits 110, a calibration circuit 120 and a controlling circuit 130. It is noted that each of the ADC circuits 110 is operated to be a signal channel. In other words, the ADC device 100 includes M channels in this example. In some embodiments, M is an even number. As shown in FIG. 1A, each of the ADC circuits 110 is configured to perform an analog-to-digital conversion on an input signal SIN according to one of the clock signals $CLK_0$-$CLK_{M-1}$ to generate one of quantized outputs $Q_0$-$Q_{M-1}$.

As shown in FIG. 1B, there is a time interval between two adjacent clock signals of the clock signals $CLK_0$-$CLK_{M-1}$. Therefore, two adjacent channels would perform sampling operations and analog-to-digital conversions at different times. For example, the first channel (that is, the ADC circuit 110 operated according to the clock signal $CLK_0$) samples the input signal SIN at a first sampling time S1 and performs the analog-to-digital conversion, the second channel (that is, the ADC circuit 110 operated according to the clock signal $CLK_1$) samples the input signal SIN at a second sampling time S2 and performs the analog-to-digital conversion, and the third channel (that is, the ADC circuit 110 operated according to the clock signal $CLK_2$) samples the input signal SIN at a third sampling time S3 and performs the analog-to-digital conversion. A difference between the sampling time S1 and sampling time S2 is a sampling period SP (which corresponds to a sampling frequency fs, that is, SP=1/fs). By analogy, M channels can be operated according to multiple interleaved timings.

The calibration circuit 120 is coupled to each of the ADC circuits 110 to receive the quantized outputs $Q_0$-$Q_{M-1}$. The calibration circuit 120 can perform at least one error operation according to the quantized outputs $Q_0$-$Q_{M-1}$ to generate at least one calibration information, so as to calibrate offset and gain errors of the ADC circuits 110, and generate a number of quantized outputs $CQ2_0$-$CQ2_{M-1}$ that have been calibrated. In addition, the calibration circuit 120 can analyze clock skews (equivalent to time difference information) between the ADC circuits 110 according to the quantized outputs $CQ2_0$-$CQ2_{M-1}$ that have been calibrated to generate a number of adjustment signals $T_0$-$T_{M-1}$.

As shown in FIG. 1A, the calibration circuit 120 includes an offset calibration circuit 121, a gain calibration circuit 123 and a skew adjusting circuit 125. The offset calibration circuit 121 is electrically coupled to each of the ADC circuits 110 to receive the quantized outputs $Q_0$-$Q_{M-1}$. In some embodiments, the offset calibration circuit 121 is configured to perform an offset error operation (i.e., the at least one error operation) according to the quantized outputs $Q_0$-$Q_{M-1}$ to generate an offset calibration information (i.e., the at least one calibration information), and reduce the offset error of the quantized outputs $Q_0$-$Q_{M-1}$ by the offset calibration information to generate a number of quantized outputs $CQ1_0$-$CQ1_{M-1}$.

Following the above descriptions, the gain calibration circuit 123 is electrically coupled to the offset calibration circuit 121 to receive the quantized outputs $CQ1_0$-$CQ1_{M-1}$. In some embodiments, the gain calibration circuit 123 is configured to perform a gain error operation (i.e., the at least one error operation) according to the quantized outputs $CQ1_0$-$CQ1_{M-1}$ to generate gain calibration information (i.e., the at least one calibration information), and reduce the gain error of the quantized outputs $CQ1_0$-$CQ1_{M-1}$ by the gain calibration information to generate the quantized outputs $CQ2_0$-$CQ2_{M-1}$ that have been calibrated.

Following the above descriptions, the skew adjusting circuit 125 is electrically coupled to the gain calibration circuit 123 to receive the quantized outputs $CQ2_0$-$CQ2_{M-1}$ that have been calibrated. In some embodiments, the skew adjusting circuit 125 is configured to analyze the quantized outputs $CQ2_0$-$CQ2_{M-1}$ that have been calibrated to generate the adjustment signals $T_0$-$T_{M-1}$. In some embodiments, the skew adjusting circuit 125 outputs the adjustment signals $T_0$-$T_{M-1}$ to the ADC circuits 110, and the adjustment signals $T_0$-$T_{M-1}$ are configured to indicate timings required to be adjusted by the ADC circuits 110 due to the clock skews.

In greater detail, because the quantized output $CQ2_0$ corresponds to the first sampling time S1 and the quantized output $CQ2_1$ corresponds to the second sampling time S2, a time difference between the two corresponding times is 1 sampling period SP. Therefore, time difference information within 1 sampling period SP of the clock signal $CLK_0$ and the clock signal $CLK_1$ can be obtained by analyzing the quantized output $CQ2_0$ and the quantized output $CQ2_1$. By analogy, time difference information within 1 sampling period SP of each pair of adjacent clock signals of the clock signals $CLK_0$-$CLK_{M-1}$ can be analyzed by the skew adjusting circuit 125, by using this disposition method.

The above-described disposition method for analyzing the time difference information within 1 sampling period SP of each pair of adjacent clock signals of the clock signals $CLK_0$-$CLK_{M-1}$ is only for illustrative purpose, and the present disclosure is not limited in this regard. In some embodiments, the skew adjusting circuit 125 can respectively analyze time difference information within 2 sampling periods SP of the even-numbered clock signals $CLK_0$, $CLK_2$ ... $CLK_{M-2}$ and time difference information within 2 sampling periods SP of the odd-numbered clock signals $CLK_1$, $CLK_3$ ... $CLK_{M-1}$.

In some embodiments, the ADC circuits 110 can adjust the execution timings of the sampling operations and/or the analog-to-digital conversions according to the adjustment signals $T_0$-$T_{M-1}$ to calibrate the clock skews equivalently. In other embodiments, timings of the clock signals $CLK_0$-$CLK_{M-1}$ can be adjusted directly according to the adjustment signals $T_0$-$T_{M-1}$ to calibrate the clock skews equivalently. For example, the adjustment signals $T_0$-$T_{M-1}$ are inputted to a clock generator, a phase interpolator, or a digital delay control line configured to generate the clock signal $CLK_0$-$CLK_{M-1}$ so as to adjust phases of the clock signals $CLK_0$-$CLK_{M-1}$. The above disposition method for calibrating the clock skews according to the adjustment signals $T_0$-$T_{M-1}$ is only for illustrative purpose, and the present disclosure is not limited in this regard.

As shown in FIG. 1A again, the controlling circuit 130 is electrically coupled to each of the ADC circuits 110 and the calibration circuit 120 to receive the quantized outputs $Q_0$-$Q_{M-1}$. In some embodiments, the controlling circuit 130 is configured to analyze the quantized outputs $Q_0$-$Q_{M-1}$ to generate at least one control signal (e.g., CSo, CSg, CSs as shown in FIG. 1A) to the calibration circuit 120. The operations here will be explained in detail in the following paragraphs with reference to FIG. 2.

Figure 2:
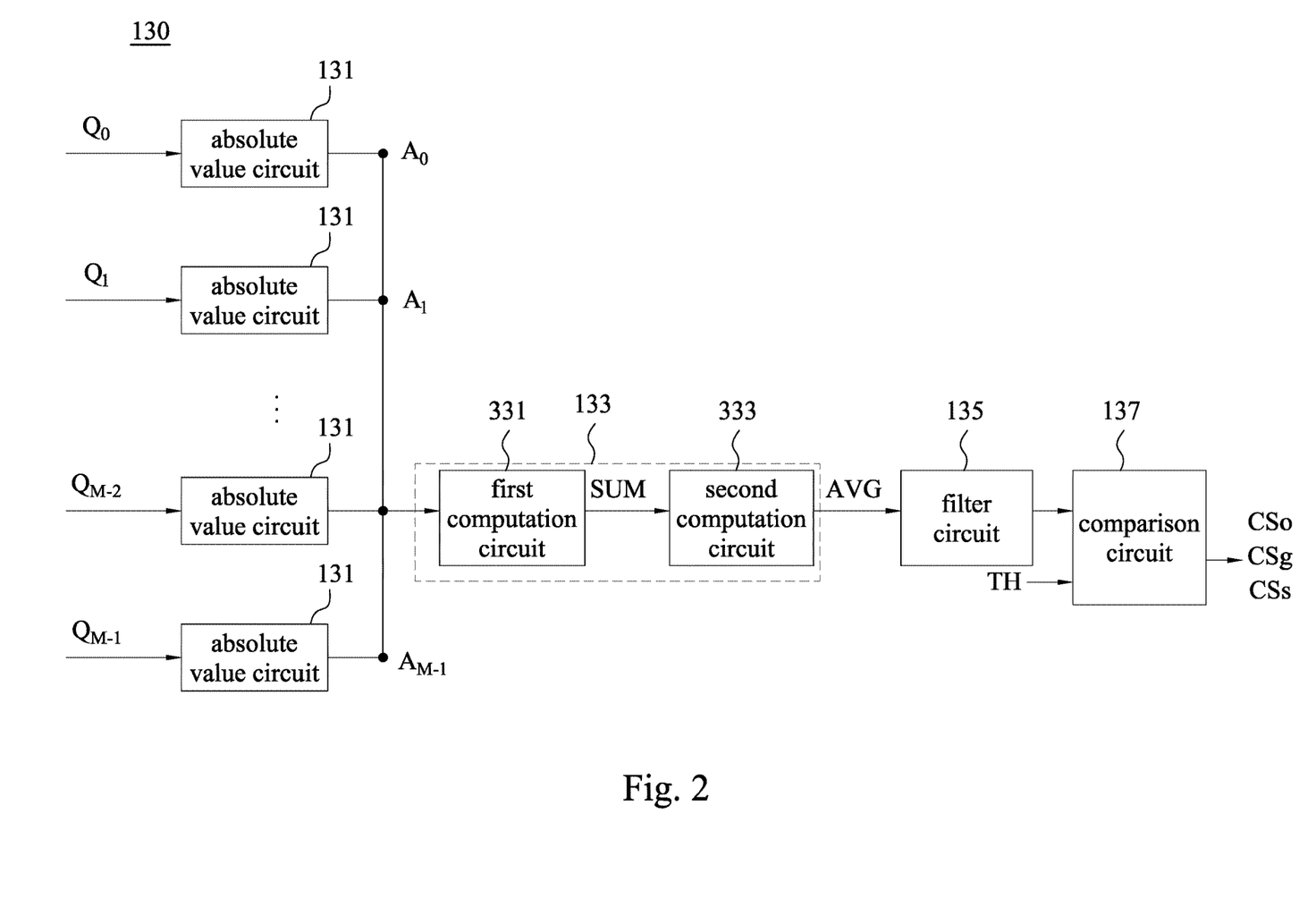
FIG. 2 depicts a schematic diagram of a controlling circuit in the ADC device in accordance with some embodiments of the present disclosure.

Referring to FIG. 2, FIG. 2 depicts a schematic diagram of the controlling circuit 130 of FIG. 1A in accordance with some embodiments of the present disclosure. In some embodiments, the controlling circuit 130 includes a number of absolute value circuits 131, an averaging circuit 133, a filter circuit 135 and a comparison circuit 137.

The absolute value circuits 131 are electrically coupled to the ADC circuits 110 to receive the quantized outputs $Q_0$-$Q_{M-1}$. In some embodiments, each of the absolute value circuits 131 performs an absolute value operation according to a corresponding quantized output of the quantized outputs $Q_0$-$Q_{M-1}$ to generate a corresponding absolute value signal of a number of absolute value signals $A_0$-$A_{M-1}$. The $1^{st}$ absolute value circuit 131 is taken for example. The $1^{st}$ absolute value circuit 131 receives the quantized output $Q_0$, and performs the absolute value operation to obtain an absolute value of the quantized output $Q_0$ so as to generate the absolute value signal $A_0$. Since the disposition method and operation of the remaining absolute value circuits 131 can be deduced by analogy, a description in this regard is not repeated here. In some embodiments, the absolute value circuit 131 may be implemented by using a processing circuit or a rectifier circuit. Various circuits that can realize the absolute value circuit 131 are within the scope of the present disclosure.

The average circuit 133 is electrically coupled to the absolute value circuits 131 to receive the absolute value signals $A_0$-$A_{M-1}$. In some embodiments, the average circuit 133 is configured to perform an average value operation according to the absolute value signals $A_0$-$A_{M-1}$ to average the absolute value signals $A_0$-$A_{M-1}$ so as to generate an average signal AVG. In some embodiments, the average circuit 133 may be implemented by using a digital processing circuit, but the present disclosure is not limited in this regard.

As shown in FIG. 2, in some embodiments, the average circuit 133 includes a first computation circuit 331 and a second computation circuit 333. The first computation circuit 331 is electrically coupled to the absolute value circuits 131 to receive the absolute value signals $A_0$-$A_{M-1}$. In some embodiments, the first computation circuit 331 is configured to perform a sum operation according to the absolute value signals $A_0$-$A_{M-1}$ to sum the absolute value signals $A_0$-$A_{M-1}$, so as to generate a sum signal SUM. In some embodiments, the first computation circuit 331 can be implemented by using an adder or other processing circuits having the same function. Various circuits that can realize the first computation circuit 331 are within the scope of the present disclosure.

Following the above descriptions, the second computation circuit 333 is electrically coupled to the first computation circuit 331 to receive the sum signal SUM. In some embodiments, the second computation circuit 333 is configured to perform a division operation on the sum signal SUM to generate the average signal AVG. In particular, the second computation circuit 333 can divide the sum signal SUM by M (i.e., the number of the channels) to generate the average signal AVG. In some embodiments, the second computation circuit 333 can be implemented by using a divider or other processing circuits having the same function. Various circuits that can realize the second computation circuit 333 are within the scope of the present disclosure.

The filter circuit 135 is electrically coupled to the average circuit 133 to receive the average signal AVG. In some embodiments, the filter circuit 135 is configured to filter the average signal AVG.

The comparison circuit 137 is electrically coupled to the filter circuit 135 to receive the average signal AVG that has been filtered. In some embodiments, the comparison circuit 137 is configured to compare the average signal AVG with at least one threshold value (e.g., TH as shown in FIG. 2) to generate the at least one control signal (e.g., CSo, CSg, CSs as shown in FIG. 2) to the calibration circuit 120.

Because the quantized outputs $Q_0$-$Q_{M-1}$ are generated by converting the magnitude of the input signal SIN through the ADC circuits 110, the average signal AVG generated according to the quantized outputs $Q_0$-$Q_{M-1}$ is related to the magnitude of the input signal SIN. In addition, a threshold value TH for comparing to the average signal AVG is also related to the magnitude of the input signal SIN. In particular, the average signal AVG can correspond to the magnitude of the current input signal SIN, and the threshold value TH can correspond to a predetermined magnitude (e.g., 20% of the maximal magnitude of the input signal SIN). In other words, in the embodiment of FIG. 2, the controlling circuit 130 is configured to generate the at least one control signal according to the magnitude of the input signal SIN, but the present disclosure is not limited in this regard. In other words, the controlling circuit 130 is configured to generate the at least one control signal according to the power of the input signal SIN.

In some embodiments, the calibration circuit 120 may selectively perform the at least one error operation according to the at least one control signal, to generate the at least one calibration information. In addition, the calibration circuit 120 may selectively analyze the clock skews (equivalent to the time difference information of the clock signals $CLK_0$-$CLK_{M-1}$) between the ADC circuits 110, to generate the adjustment signals $T_0$-$T_{M-1}$.

In some embodiments, because the magnitude of the input signal SIN is large (or a continuous number of the quantized outputs $Q_0$-$Q_{M-1}$ is changed more in numeral value), the average signal AVG is greater or equal to the threshold value TH. Accordingly, the controlling circuit 130 may generate three control signals CSo, CSg and CSs with a first voltage level (e.g., high voltage level) to the calibration circuit 120, to enable the offset calibration circuit 121, the gain calibration circuit 123 and the skew adjusting circuit 125 simultaneously. In other words, the offset calibration circuit 121 performs the offset error operation according to the control signal CSo with the high voltage level to generate the offset calibration information, the gain calibration circuit 123 performs the gain error operation according to the control signal CSg with the high voltage level to generate the gain calibration information, and the skew adjusting circuit 125 analyzes the time difference information of the clock signals $CLK_0$-$CLK_{M-1}$ according to the control signal CSs with the high voltage level to generate the adjustment signals $T_0$-$T_{M-1}$.

In some embodiments, because the magnitude of the input signal SIN is small (or a continuous number of the quantized outputs $Q_0$-$Q_{M-1}$ is changed less in numeral value), the average signal AVG is smaller than the threshold value TH. Accordingly, the controlling circuit 130 may generate three control signals CSo, CSg and CSs with a second voltage level (e.g., low voltage level) to the calibration circuit 120, to disable the offset calibration circuit 121, the gain calibration circuit 123 and the skew adjusting circuit 125 simultaneously. In other words, the offset calibration circuit 121 does not generate the offset calibration information according to the control signal CSo with the low voltage level, the gain calibration circuit 123 does not generate the gain calibration information according to the control signal CSg with the low voltage level, and the skew adjusting circuit 125 does not analyze the time difference information of the clock signals $CLK_0$-$CLK_{M-1}$ according to the control signal CSs with the low voltage level.

In a condition that the offset calibration circuit 121, the gain calibration circuit 123 and the skew adjusting circuit 125 are all disabled, the calibration circuit 120 would calibrate the quantized outputs $Q_0$-$Q_{M-1}$ with the calibration information generated previously, to generate the quantized outputs $CQ2_0$-$CQ2_{M-1}$. In addition, the calibration circuit 120 would directly output the adjustment signals $T_0$-$T_{M-1}$ generated previously, to calibrate the clock skews. In some embodiments, the ADC device 100 includes a memory circuit (not shown), and the memory circuit is configured to store the calibration information generated previously and the adjustment signals $T_0$-$T_{M-1}$ generated previously.

For describing conveniently, the quantized outputs $Q_0$-$Q_{M-1}$, the quantized outputs $CQ1_0$-$CQ1_{M-1}$ and the quantized outputs $CQ2_0$-$CQ2_{M-1}$ corresponding to the $N^{th}$ period of the clock signals $CLK_0$-$CLK_{M-1}$ are regarded as the $N^{th}$ period of the quantized outputs $Q_0$-$Q_{M-1}$, the $N^{th}$ period of the quantized outputs $CQ1_0$-$CQ1_{M-1}$ and the $N^{th}$ period of the quantized outputs $CQ2_0$-$CQ2_{M-1}$, respectively.

The naming of other signals is deduced by analogy. In some practical applications, the ADC circuits 110 output the $N^{th}$ period of the quantized outputs $Q_0$-$Q_{M-1}$, wherein N is positive integer. The calibration circuit 120 calibrates the $N^{th}$ period of the quantized outputs $Q_0$-$Q_{M-1}$ by the offset calibration circuit 121 and the gain calibration circuit 123, to generate the $N^{th}$ period of the quantized outputs $CQ2_0$-$CQ2_{M-1}$. In addition, the calibration circuit 120 analyzes the $N^{th}$ period of the quantized outputs $CQ2_0$-$CQ2_{M-1}$ by the skew adjusting circuit 125, to generate the $N^{th}$ period of the adjustment signals $T_0$-$T_{M-1}$.

Following the above descriptions, the controlling circuit 130 analyzes the $N^{th}$ period of the quantized outputs $Q_0$-$Q_{M-1}$ to generate the $N^{th}$ period of the control signals CSo, CSg and CSs to the calibration circuit 120. Accordingly, the calibration circuit 120 can selectively perform the at least one error operation on the $(N+1)^{th}$ period of the quantized outputs $Q_0$-$Q_{M-1}$ and selectively analyze the time difference information of the $(N+1)^{th}$ period of the clock signals $CLK_0$-$CLK_{M-1}$ according to the $N^{th}$ period of the control signals CSo, CSg and CSs.

For example, if the $N^{th}$ period of the control signal CSo has the high voltage level, the offset calibration circuit 121 of the calibration circuit 120 performs the offset error operation according to the $(N+1)^{th}$ period of the quantized outputs $Q_0$-$Q_{M-1}$ to generate the offset calibration information, and reduces the offset error of the $(N+1)^{th}$ period of the quantized outputs $Q_0$-$Q_{M-1}$ with the offset calibration information to generate the $(N+1)^{th}$ period of the quantized outputs $CQ1_0$-$CQ1_{M-1}$. If the $N^{th}$ period of the control signal CSo has the low voltage level, the offset calibration circuit 121 does not perform the offset error operation, and reduces the offset error of the $(N+1)^{th}$ period of the quantized outputs $Q_0$-$Q_{M-1}$ with the offset calibration information generated previously (e.g., the offset calibration information generated according to the $N^{th}$ period of the quantized outputs $Q_0$-$Q_{M-1}$) to generate the $(N+1)^{th}$ period of the quantized outputs $CQ1_0$-$CQ1_{M-1}$.

If the $N^{th}$ period of the control signal CSg has the high voltage level, the gain calibration circuit 123 of the calibration circuit 120 performs the gain error operation according to the $(N+1)^{th}$ period of the quantized outputs $CQ1_0$-$CQ1_{M-1}$ to generate the gain calibration information, and reduces the gain error of the $(N+1)^{th}$ period of the quantized outputs $CQ1_0$-$CQ1_{M-1}$ with the gain calibration information to generate the $(N+1)^{th}$ period of the quantized outputs $CQ2_0$-$CQ2_{M-1}$. If the $N^{th}$ period of the control signal CSg has the low voltage level, the gain calibration circuit 123 does not perform the gain error operation, and reduces the gain error of the $(N+1)^{th}$ period of the quantized outputs $CQ1_0$-$CQ1_{M-1}$ with the gain calibration information generated previously (e.g., the gain calibration information generated according to the $N^{th}$ period of the quantized outputs $CQ1_0$-$CQ1_{M-1}$) to generate the $(N+1)^{th}$ period of the quantized outputs $CQ2_0$-$CQ2_{M-1}$.

If the $N^{th}$ period of the control signal CSs has the high voltage level, the skew adjusting circuit 125 of the calibration circuit 120 analyzes the $(N+1)^{th}$ period of the quantized outputs $CQ2_0$-$CQ2_{M-1}$ to generate the $(N+1)^{th}$ period of the adjustment signals $T_0$-$T_{M-1}$ to the ADC circuits 110. If the $N^{th}$ period of the control signal CSs has the low voltage level, the skew adjusting circuit 125 does not analyze the $(N+1)^{th}$ period of the quantized outputs $CQ2_0$-$CQ2_{M-1}$, and outputs the adjustment signals $T_0$-$T_{M-1}$ generated previously (e.g., the $N^{th}$ period of the adjustment signals $T_0$-$T_{M-1}$ generated according to the $N^{th}$ period of the quantized outputs $CQ2_0$-$CQ2_{M-1}$) to the ADC circuits 110.

In the above embodiments, the comparison circuit 137 of the controlling circuit 130 generates the control signals CSo, CSg and CSs according to the comparison result of the filtered average signal AVG and one threshold value TH, to disable/enable the offset calibration circuit 121, the gain calibration circuit 123 and the skew adjusting circuit 125 of the calibration circuit 120 simultaneously. However, the present disclosure is not limited in this regard. In other embodiments, the comparison circuit 137 of the controlling circuit 130 generates the control signals CSo, CSg and CSs with different voltage levels according to the comparison result of the filtered average signal AVG and a number of threshold values, to disable/enable the offset calibration circuit 121, the gain calibration circuit 123 and the skew adjusting circuit 125 of the calibration circuit 120, respectively.

For example, the comparison circuit 137 compares the average signal AVG with a first threshold value TH1 and a second threshold value TH2, in which the second threshold value TH2 is greater than the first threshold value TH1. If the average signal AVG is smaller than the first threshold value TH1, the controlling circuit 130 outputs one control signal CSo with the high voltage level and two control signals CSg and CSs with the low voltage level, to enable the offset calibration circuit 121 and to disable the gain calibration circuit 123 and the skew adjusting circuit 125. If the average signal AVG is greater than the first threshold value TH1 but is smaller than the second threshold value TH2, the controlling circuit 130 outputs two control signals CSo and CSg with the high voltage level and one control signal CSs with the low voltage level, to enable the offset calibration circuit 121 and the gain calibration circuit 123 and to disable the skew adjusting circuit 125. If the average signal AVG is greater than the second threshold value TH2, the controlling circuit 130 outputs three control signals CSo, CSg and CSs with the high voltage level, to enable the offset calibration circuit 121, the gain calibration circuit 123 and the skew adjusting circuit 125. In other words, the smaller the magnitude of the input signal SIN is, the more the number of the circuits disabled by the controlling circuit 130 is.

Figure 3:
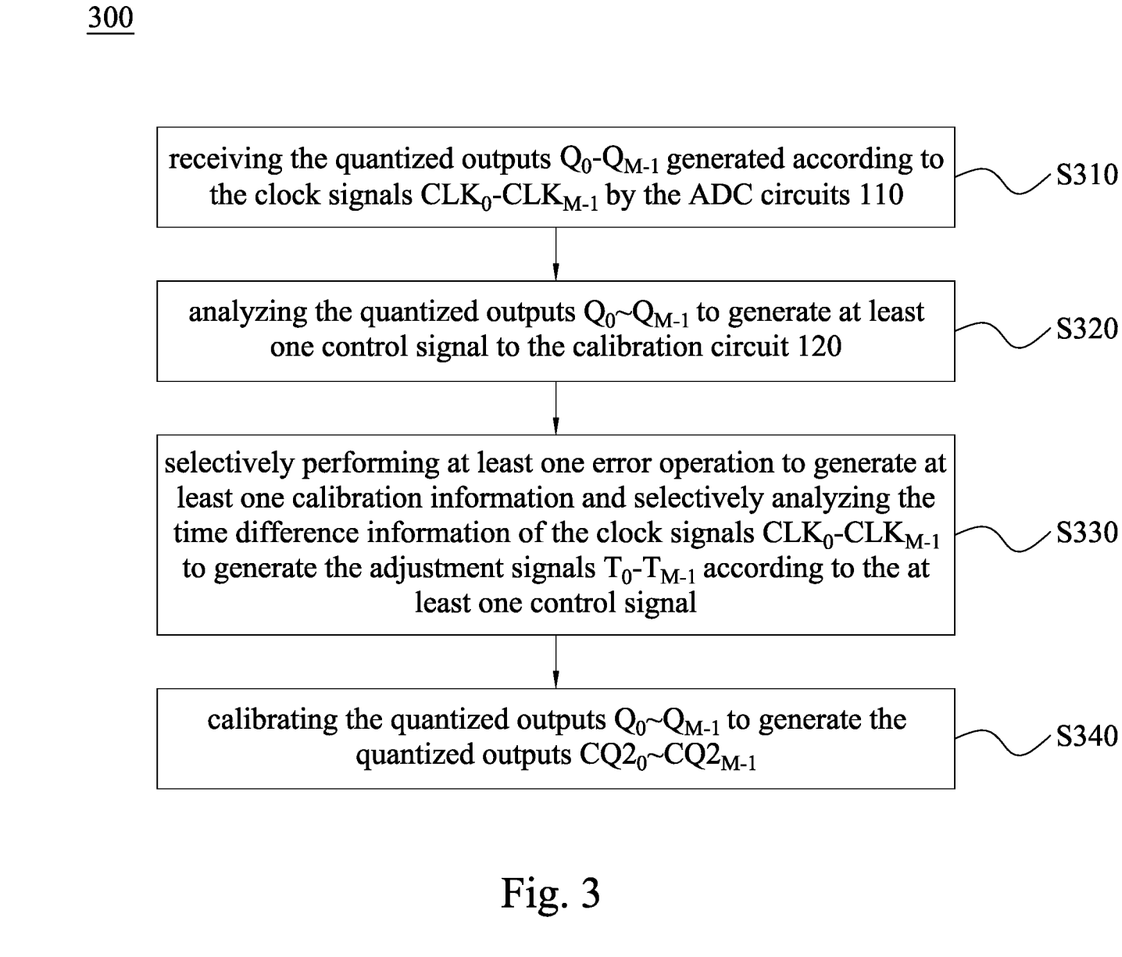
FIG. 3 depicts a flow diagram of a method for controlling calibration circuit in accordance with some embodiments of the present disclosure.

Referring to FIG. 3, FIG. 3 depicts a flow diagram of a method for controlling calibration circuit 300 in accordance with some embodiments of the present disclosure. For ease of understanding, the method for controlling calibration circuit 300 is described with reference to the foregoing figures. In some embodiments, the method for controlling calibration circuit 300 may be executed by the ADC device 100 of FIG. 1A. In one embodiment, the method for controlling calibration circuit 300 first executes step S310 to receive the quantized outputs $Q_0$-$Q_{M-1}$ generated according to the clock signals $CLK_0$-$CLK_{M-1}$ by the ADC circuits 110, by the calibration circuit 120.

The method for controlling calibration circuit 300 then executes step S320 to analyze the quantized outputs $Q_0$-$Q_{M-1}$, by the controlling circuit 130, to generate at least one control signal (e.g., the control signals CSo, CSg and CSs) to the calibration circuit 120.

The method for controlling calibration circuit 300 then executes step S330 to selectively perform at least one error operation to generate at least one calibration information and selectively analyze the time difference information of the clock signals $CLK_0$-$CLK_{M-1}$ to generate the adjustment signals $T_0$-$T_{M-1}$ according to the at least one control signal, by the calibration circuit 120.

After that, the method for controlling calibration circuit 300 executes step S340 to calibrate the quantized outputs $Q_0$-$Q_{M-1}$, by the calibration circuit 120, to generate the quantized outputs $CQ2_0$-$CQ2_{M-1}$. Since the description of the above various steps and their implementation methods may refer to the description of the foregoing embodiments, a description in this regard is not repeated here.

In sum, the ADC device 100 and the method for controlling calibration circuit 300 of the present disclosure analyzes the quantized outputs $Q_0$-$Q_{M-1}$ generated by the ADC circuits 110 to generate at least one control signal for controlling the calibration circuit 120. In the condition that the input signal SIN is weak (e.g., the magnitude or the power is too small), the ADC device 100 controls the calibration circuit 230 by the at least one control signal to generate the quantized outputs $CQ2_0$-$CQ2_{M-1}$ according to the calibration information generated previously (or/and controls the calibration circuit 230 to output the adjustment signals $T_0$-$T_{M-1}$ generated previously), so as to avoid the calibration performed by the calibration circuit 120 being affected due to the weak input signal. In such way, the problem that the phase errors between the ADC circuits 110 are incorrectly converged can also be solved.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the invention. In view of the foregoing, it is intended that the present invention cover modifications and variations of this invention provided they fall within the scope of the following claims.

What is claimed is:

1. An analog to digital converter device, comprising:
    a plurality of analog to digital converter circuits configured to convert an input signal according to a plurality of clock signals which is interleaved, to generate a plurality of first quantized outputs;
    a calibration circuit configured to perform at least one error operation according to the first quantized outputs to generate at least one calibration information, configured to calibrate the first quantized outputs by the at least one calibration information to generate a plurality of second quantized outputs, and configured to analyze a plurality of time difference information of the clock signals according to the second quantized outputs to generate a plurality of adjustment signals, wherein the adjustment signals are configured to reduce a clock skew of the analog to digital converter circuits; and
    a controlling circuit configured to receive and analyze the first quantized outputs to generate at least one control signal to the calibration circuit, wherein the at least one control signal is configured to control the calibration circuit to selectively perform the at least one error operation and selectively analyze the time difference information of the clock signals.

2. The analog to digital converter device of claim 1, wherein the controlling circuit is configured to analyze the $N^{th}$ period of the first quantized outputs to generate the $N^{th}$ period of the at least one control signal,
    the calibration circuit is configured to selectively perform the at least one error operation on the $(N+1)^{th}$ period of the first quantized outputs and selectively analyze the time difference information of the $(N+1)^{th}$ period of the clock signals according to the $N^{th}$ period of the at least one control signal, wherein N is positive integer.

3. The analog to digital converter device of claim 2, wherein when the calibration circuit performs the at least one error operation on the $(N+1)^{th}$ period of the first quantized outputs, the calibration circuit calibrates the $(N+1)^{th}$ period of the first quantized outputs by the at least one calibration information generated according to the $(N+1)^{th}$ period of the first quantized outputs, to generate the $(N+1)^{th}$ period of the second quantized outputs.

4. The analog to digital converter device of claim 3, wherein when the calibration circuit does not perform the at least one error operation on the $(N+1)^{th}$ period of the first quantized outputs, the calibration circuit calibrates the $(N+1)^{th}$ period of the first quantized outputs by the at least one calibration information generated previously, to generate the $(N+1)^{th}$ period of the second quantized outputs.

5. The analog to digital converter device of claim 2, wherein when the calibration circuit analyzes the time difference information of the $(N+1)^{th}$ period of the clock signals, the calibration circuit analyzes the $(N+1)^{th}$ period of the second quantized outputs to generate the $(N+1)^{th}$ period of the adjustment signals.

6. The analog to digital converter device of claim 5, wherein when the calibration circuit does not analyze the time difference information of the $(N+1)^{th}$ period of the clock signals, the calibration circuit outputs the $N^{th}$ period of the adjustment signals.

7. The analog to digital converter device of claim 1, wherein the controlling circuit comprises:
    a plurality of absolute value circuits configured to receive the first quantized outputs to output a plurality of absolute value signals, wherein each of the absolute value circuits is configured to perform an absolute value operation according to a corresponding first quantized output of the first quantized outputs, to generate a corresponding absolute value signal of the absolute value signals;
    an average circuit configured to perform an average value operation to average the absolute value signals, to generate an average signal;
    a filter circuit configured to filter the average signal; and
    a comparison circuit configured to compare the average signal that has been filtered with at least one threshold value, to generate the at least one control signal.

8. The analog to digital converter device of claim 1, wherein the calibration circuit comprises:
    a skew adjusting circuit configured to analyze the second quantized outputs to generate the adjustment signals to the analog to digital converter circuits.

9. The analog to digital converter device of claim 1, wherein the at least one calibration information comprises gain calibration information, the at least one error operation comprises a gain error operation, and the calibration circuit further comprises:
    a gain calibration circuit configured to perform the gain error operation according to the first quantized outputs to generate the gain calibration information, and configured to generate the second quantized outputs by the gain calibration information.

10. The analog to digital converter device of claim 9, wherein the at least one calibration information further comprises offset calibration information, the at least one error operation comprises an offset error operation, and the calibration circuit further comprises:
    an offset calibration circuit configured to receive the first quantized outputs, configured to perform the offset error operation according to the first quantized outputs to generate the offset calibration information, and configured to calibrate the first quantized outputs by the offset calibration information to generate a plurality of third quantized outputs, wherein the gain calibration circuit is configured to calibrate the third quantized outputs by the gain calibration information to generate the second quantized outputs.

11. A method for controlling calibration circuit, comprising:
by a controlling circuit, receiving a plurality of first quantized outputs generated according to a plurality of clock signals which is interleaved by a plurality of analog to digital converter circuits;
by the controlling circuit, analyzing the first quantized outputs, to generate at least one control signal to a calibration circuit;
by the calibration circuit, selectively performing at least one error operation to generate at least one calibration information and selectively analyzing a plurality of time difference information of the clock signals to generate a plurality of adjustment signals according to the at least one control signal, wherein the adjustment signals are configured to reduce a clock skew of the analog to digital converter circuits; and
by the calibration circuit, calibrating the first quantized outputs, to generate a plurality of second quantized outputs.

12. The method for controlling calibration circuit of claim 11, wherein the controlling circuit is configured to analyze the $N^{th}$ period of the first quantized outputs to generate the $N^{th}$ period of the at least one control signal,
the calibration circuit is configured to selectively perform the at least one error operation on the $(N+1)^{th}$ period of the first quantized outputs and selectively analyze the time difference information of the $(N+1)^{th}$ period of the clock signals according to the $N^{th}$ period of the at least one control signal, wherein N is positive integer.

13. The method for controlling calibration circuit of claim 12, wherein when the calibration circuit performs the at least one error operation on the $(N+1)^{th}$ period of the first quantized outputs, the calibration circuit calibrates the $(N+1)^{th}$ period of the first quantized outputs by the at least one calibration information generated according to the $(N+1)^{th}$ period of the first quantized outputs, to generate the $(N+1)^{th}$ period of the second quantized outputs.

14. The method for controlling calibration circuit of claim 13, wherein when the calibration circuit does not perform the at least one error operation on the $(N+1)^{th}$ period of the first quantized outputs, the calibration circuit calibrates the $(N+1)^{th}$ period of the first quantized outputs by the at least one calibration information generated previously, to generate the $(N+1)^{th}$ period of the second quantized outputs.

15. The method for controlling calibration circuit of claim 12, wherein when the calibration circuit analyzes the time difference information of the $(N+1)^{th}$ period of the clock signals, the calibration circuit analyzes the $(N+1)^{th}$ period of the second quantized outputs to generate the $(N+1)^{th}$ period of the adjustment signals.

16. The method for controlling calibration circuit of claim 15 wherein when the calibration circuit does not analyze the time difference information of the $(N+1)^{th}$ period of the clock signals, the calibration circuit outputs the $N^{th}$ period of the adjustment signals.

17. The method for controlling calibration circuit of claim 11, wherein generating the at least one control signal comprises:
performing an absolute value operation according to a corresponding first quantized output of the first quantized outputs, to generate a corresponding absolute value signal of a plurality of absolute value signals;
performing an average value operation to average the absolute value signals, to generate an average signal;
filtering the average signal; and
comparing the average signal that has been filtered with at least one threshold value, to generate the at least one control signal.

18. The method for controlling calibration circuit of claim 11, wherein generating the adjustment signals comprises:
by a skew adjusting circuit of the calibration circuit, analyzing the second quantized outputs to generate the adjustment signals to the analog to digital converter circuits.

19. The method for controlling calibration circuit of claim 11, wherein the at least one calibration information comprises gain calibration information, the at least one error operation comprises a gain error operation, and generating the second quantized outputs comprises:
by a gain calibration circuit of the calibration circuit, performing the gain error operation according to the first quantized outputs to generate the gain calibration information, and generating the second quantized outputs by the gain calibration information.

20. The method for controlling calibration circuit of claim 19, wherein the at least one calibration information further comprises offset calibration information, the at least one error operation comprises an offset error operation, and generating the second quantized outputs further comprises:
by an offset calibration circuit of the calibration circuit, receiving the first quantized outputs; and
by the offset calibration circuit, performing the offset error operation according to the first quantized outputs to generate the offset calibration information, and calibrating the first quantized outputs by the offset calibration information to generate a plurality of third quantized outputs, wherein the gain calibration circuit is configured to calibrate the third quantized outputs by the gain calibration information to generate the second quantized outputs.

* * * * *